(12) United States Patent
Park et al.

(10) Patent No.: US 9,761,649 B2
(45) Date of Patent: Sep. 12, 2017

(54) THIN FILM TRANSISTOR ARRAY SUBSTRATE, METHOD OF MANUFACTURING THE SAME, AND ORGANIC LIGHT-EMITTING DIODE (OLED) DISPLAY INCLUDING THE SAME

(71) Applicant: Samsung Display Co., Ltd., Yongin, Gyeonggi-Do (KR)

(72) Inventors: Sangjin Park, Yongin (KR); Myungho Kim, Yongin (KR); Sanghui Park, Yongin (KR); Keunchang Lee, Yongin (KR); Jaesung Cha, Yongin (KR); Taehyeok Choi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 31 days.

(21) Appl. No.: 14/709,340

(22) Filed: May 11, 2015

(65) Prior Publication Data
US 2016/0111483 A1   Apr. 21, 2016

(30) Foreign Application Priority Data
Oct. 16, 2014   (KR) .......................... 10-2014-0140175

(51) Int. Cl.
*H01L 27/32* (2006.01)
*H01L 27/12* (2006.01)

(52) U.S. Cl.
CPC ...... *H01L 27/3265* (2013.01); *H01L 27/1255* (2013.01); *H01L 27/1259* (2013.01); *H01L 2227/323* (2013.01)

(58) Field of Classification Search
CPC ................................................. H01L 2227/323
See application file for complete search history.

(56) References Cited

U.S. PATENT DOCUMENTS

| | | | |
|---|---|---|---|
| 8,765,535 B2 * | 7/2014 | Akimoto | H01L 27/1266 257/E21.568 |
| 9,196,667 B2 * | 11/2015 | Im | H01L 51/5228 |
| 9,530,830 B2 * | 12/2016 | Ryu | H01L 27/3248 |
| 2003/0117559 A1 | 6/2003 | Kim et al. | |
| 2003/0127650 A1 * | 7/2003 | Park | H01L 27/3244 257/72 |
| 2007/0102707 A1 * | 5/2007 | Lee | H01L 27/1255 257/72 |
| 2009/0085081 A1 * | 4/2009 | Akimoto | H01L 27/1266 257/296 |
| 2011/0297941 A1 * | 12/2011 | Zhan | H01L 28/87 257/59 |

(Continued)

FOREIGN PATENT DOCUMENTS

| | | |
|---|---|---|
| KR | 10-2003-0054142 A | 7/2003 |
| KR | 10-2012-0056678 A | 6/2012 |
| KR | 10-2014-0046519 A | 4/2014 |

*Primary Examiner* — Caridad Everhart
*Assistant Examiner* — Ankush Singal
(74) *Attorney, Agent, or Firm* — Knobbe Martens Olson & Bear LLP

(57) ABSTRACT

A thin film transistor (TFT) array substrate is disclosed. In one aspect, the substrate includes a buffer layer formed over a substrate, a storage capacitor formed in the buffer layer and including a first electrode and a second electrode surrounding and insulated from the first electrode and a driving TFT formed over the buffer layer.

13 Claims, 5 Drawing Sheets

(56) References Cited

U.S. PATENT DOCUMENTS

| | | | |
|---|---|---|---|
| 2012/0132920 A1 | 5/2012 | Park et al. | |
| 2013/0320330 A1* | 12/2013 | Yamazaki | H01L 29/78693 257/43 |
| 2014/0049455 A1 | 2/2014 | Kim et al. | |
| 2014/0091331 A1 | 4/2014 | Ning et al. | |
| 2014/0098077 A1 | 4/2014 | Jin et al. | |
| 2014/0159010 A1* | 6/2014 | Song | H01L 27/3276 257/40 |
| 2014/0175445 A1* | 6/2014 | Cai | G02F 1/136213 257/70 |
| 2015/0102316 A1* | 4/2015 | Park | H01L 27/3258 257/40 |
| 2015/0102349 A1* | 4/2015 | Lee | H01L 27/1255 257/71 |
| 2016/0056221 A1* | 2/2016 | Kim | H01L 51/5271 257/40 |
| 2016/0099300 A1* | 4/2016 | Lee | H01L 27/3265 257/40 |
| 2016/0118420 A1* | 4/2016 | Yang | H01L 27/124 257/40 |
| 2016/0190221 A1* | 6/2016 | Cho | H01L 27/3265 257/40 |

\* cited by examiner

THIN FILM TRANSISTOR ARRAY SUBSTRATE, METHOD OF MANUFACTURING THE SAME, AND ORGANIC LIGHT-EMITTING DIODE (OLED) DISPLAY INCLUDING THE SAME

RELATED APPLICATION

This application claims the benefit of Korean Patent Application No. 10-2014-0140175, filed on Oct. 16, 2014, in the Korean Intellectual Property Office, the disclosure of which is incorporated herein in its entirety by reference.

BACKGROUND

Field

The described technology generally relates to thin film transistor (TFT) array substrates, methods of manufacturing the same, and organic light-emitting diode (OLED) displays including the same.

Description of the Related Technology

An OLED display includes a matrix of pixels each of which has an OLED including a hole injection electrode, an electron injection electrode, and an organic emission layer formed therebetween. Excitons are generated when holes injected from the hole injection electrode and electrons injected from the electron injection electrode are combined in the organic emission layer, and light is generated when the excitons fall from an excited state to a ground state.

OLED technology has favorable characteristics such as low power consumption, lightweight, thin profile, wide viewing angle, high contrast, and fast response time. Therefore, the OLED display is considered to be a next-generation display.

SUMMARY OF CERTAIN INVENTIVE ASPECTS

One inventive aspect is a thin film transistor (TFT) array substrate, a method of manufacturing the same, and an OLED display including the same.

Another aspect is a TFT array substrate which includes: a buffer layer formed on a substrate; a storage capacitor formed in the buffer layer and including a first electrode formed in a direction perpendicular to the substrate and a second electrode formed in parallel to the first electrode and insulated from the first electrode; and a driving TFT formed on the buffer layer.

The TFT array substrate may further include a connector connecting the first electrode and a drain electrode of the driving TFT.

The storage capacitor may be formed on edges of the substrate.

The first electrode may be formed along four side edges of the substrate.

The second electrode may be formed at a predetermined distance from the first electrode and on a more outer side of the substrate than the first electrode, and the second electrode may be formed along four side edges of the substrate.

The TFT array substrate may further include a storage insulating layer formed between and in parallel to the first electrode and the second electrode.

Another aspect is a TFT array substrate which includes: a driving TFT formed on a substrate; and a storage capacitor formed in the substrate and including a first electrode formed in a direction perpendicular to the substrate and a second electrode formed in parallel to the first electrode and insulated from the first electrode.

The TFT array substrate may further include a buffer layer formed on a substrate, wherein an electrode hole may be formed in the buffer layer.

The TFT array substrate may further include: a gate insulating layer and an interlayer insulating layer formed on the buffer layer; and a connector formed on the interlayer insulating layer to connect the first electrode and a drain electrode of the driving TFT, wherein the connector may connect the first electrode and the drain electrode through the electrode hole.

The first electrode and the second electrode may be formed on edges of the substrate and may be formed along four side edges of the substrate, and the second electrode may be formed on a more outer side of the substrate than the first electrode.

Another aspect is a method of manufacturing a TFT array substrate which includes: forming a buffer layer on a substrate; forming a first pattern in the buffer layer in a direction perpendicular to the substrate and forming a second pattern in parallel to the first electrode in the buffer layer; forming a storage capacitor by depositing a first electrode and a second electrode in the first pattern and the second pattern, respectively; forming an active layer, a source electrode, and a drain electrode of a driving TFT on the buffer layer; forming a gate insulating layer insulating a gate electrode and having a contact hole on the active layer; and forming a connector connecting the first electrode and the source electrode or the drain electrode through the contact hole.

The first pattern and the second pattern may be formed on edges of the substrate and may be formed along four side edges of the substrate, and the second pattern may be formed on a more outer side of the substrate than the first pattern.

Another aspect is a method of manufacturing a TFT array substrate which includes: forming a first pattern in a substrate in a direction perpendicular to the substrate and forming a second pattern in parallel to the first electrode in the substrate; forming a storage capacitor by depositing a first electrode and a second electrode in the first pattern and the second pattern, respectively; forming a buffer layer having an electrode hole on a substrate; forming an active layer, a source electrode, and a drain electrode of a driving TFT on the buffer layer; forming a gate insulating layer insulating a gate electrode and having a contact hole on the active layer; and forming a connector connecting the first electrode and the source electrode or the drain electrode through the contact hole and the electrode hole.

Another aspect is an OLED display which includes: a display region including a plurality of pixels; and a non-display region formed around the display region, the plurality of pixels each including: a buffer layer formed on a substrate; a storage capacitor formed in the buffer layer and including a first electrode formed in a direction perpendicular to the substrate and a second electrode formed in parallel to the first electrode and insulated from the first electrode; and a driving TFT formed on the buffer layer.

Another aspect is a thin film transistor (TFT) array substrate comprising: a buffer layer formed over a substrate; a storage capacitor formed in the buffer layer and including a first electrode and a second electrode surrounding and insulated from the first electrode; and a driving TFT formed over the buffer layer. The above TFT array substrate further comprises a connector connecting the first electrode and a drain electrode of the driving TFT.

In the above TFT array substrate, the storage capacitor is formed on edges of the substrate. In the above TFT array substrate, the first electrode is formed along four side edges of the substrate. In the above TFT array substrate, the second electrode is formed at a predetermined distance from the first electrode and on a more outer side of the substrate than the first electrode, and wherein the second electrode is formed along four side edges of the substrate. The above TFT array substrate further comprises a storage insulating layer formed between and in substantially parallel to the first and second electrodes. In the above TFT array substrate, the first and second electrodes are formed on the same plane. In the above TFT array substrate, each of the first and second electrodes has a closed loop shape.

Another aspect is a thin film transistor (TFT) array substrate comprising: a driving TFT formed over a substrate; and a storage capacitor formed in the substrate and including a first electrode and a second electrode surrounding and insulated from the first electrode.

The above TFT array substrate further comprises a buffer layer formed over a substrate, wherein an electrode hole is formed in the buffer layer. The above TFT array substrate further comprises a gate insulating layer and an interlayer insulating layer formed over the buffer layer; and a connector formed on the interlayer insulating layer to connect the first electrode and a drain electrode of the driving TFT, wherein the connector connects the first electrode and the drain electrode through the electrode hole.

In the above TFT array substrate, the first and second electrodes are formed on edges of the substrate and are formed along four side edges of the substrate, and wherein the second electrode is formed on a more outer side of the substrate than the first electrode. In the above TFT array substrate, the first and second electrodes are formed on the same plane. In the above TFT array substrate, each of the first and second electrodes has a closed loop shape.

Another aspect is a method of manufacturing a thin film transistor (TFT) array substrate, comprising: forming a buffer layer over a substrate; forming a first pattern and a second pattern in the buffer layer such that the second pattern surrounds and is insulated from the first pattern; respectively depositing first and second electrodes in the first and second patterns so as to form a storage capacitor; forming an active layer, a source electrode, and a drain electrode of a driving TFT over the buffer layer; forming a gate insulating layer insulating a gate electrode and having a contact hole passing therethrough; and forming a connector connecting the first electrode and the source electrode or the drain electrode through the contact hole.

In the above method, the first and second patterns are formed on edges of the substrate and are formed along four side edges of the substrate, and wherein the second pattern is formed on a more outer side of the substrate than the first pattern.

Another aspect is a method of manufacturing a thin film transistor (TFT) array substrate, comprising: forming a first pattern and a second pattern in a substrate such that the second pattern surrounds and is insulated from the first pattern; respectively depositing first and second electrodes in the first and second patterns so as to form a storage capacitor; forming a buffer layer having an electrode hole passing therethrough; forming an active layer, a source electrode, and a drain electrode of a driving TFT over the buffer layer; forming a gate insulating layer insulating a gate electrode and having a contact hole passing therethrough; and forming a connector connecting the first electrode and the source electrode or the drain electrode through the contact hole and the electrode hole.

Another aspect is an organic light-emitting diode (OLED) display, comprising: a display region including a plurality of pixels; and a non-display region surrounding the display region, wherein each of the pixels comprises: a buffer layer formed over a substrate; a storage capacitor formed in the buffer layer and including a first electrode and a second electrode surrounding and insulated from the first electrode; and a driving TFT formed on the buffer layer.

In the above display, the first and second electrodes are formed on the same plane. In the above display, each of the first and second electrodes has a closed loop shape.

DETAILED DESCRIPTION OF CERTAIN INVENTIVE EMBODIMENTS

Figure 1:
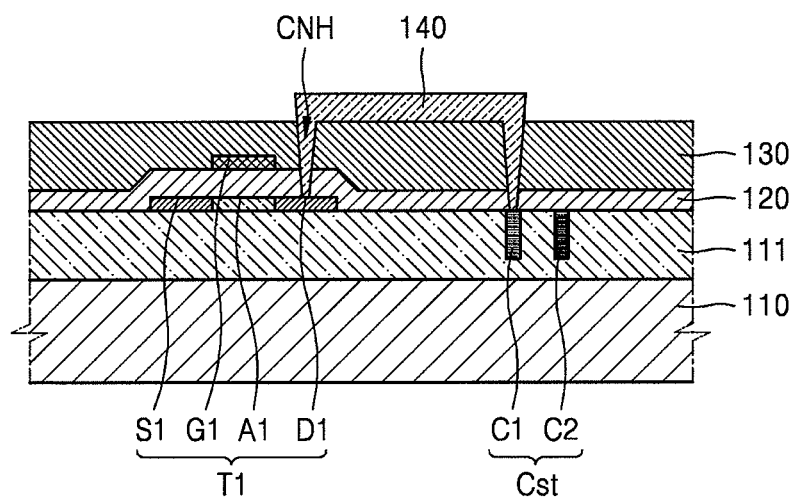
FIG. 1 is a schematic cross-sectional view of a pixel circuit of a thin film transistor (TFT) array substrate included in an organic light-emitting display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The described technology may include various embodiments and modifications, and exemplary embodiments are illustrated in the drawings and will be described below in detail. However, it will be understood that the described technology is not limited to the exemplary embodiments and includes all modifications, equivalents and substitutions falling within the spirit and scope of the described technology. Like reference numerals or symbols denote like elements throughout the specification and drawings.

Although terms such as "first" and "second" may be used herein to describe various elements or components, these elements or components should not be limited by these terms. These team are only used to distinguish one element or component from another element or component.

The terms used herein are for the purpose of describing exemplary embodiments only and are not intended to limit the described technology. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, exemplary embodiments will be described in detail with reference to the accompanying drawings.

Figure 2:
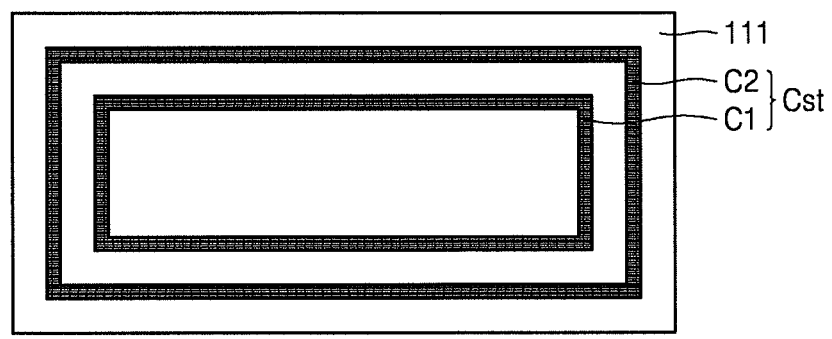
FIG. 2 is a top plan view of the TFT array substrate of FIG. 1 in which a buffer layer is formed.
Figure 3:
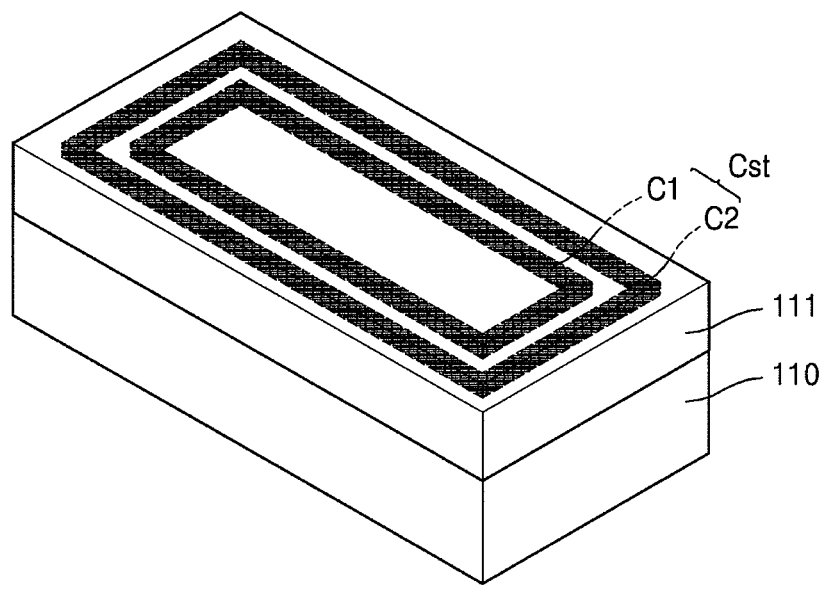
FIG. 3 is a perspective view of FIG. 2.
Figure 4:
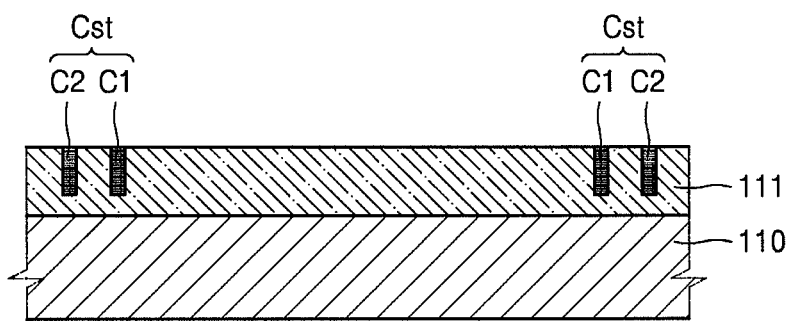
FIG. 4 is a cross-sectional view of FIG. 3.

FIG. 1 is a schematic cross-sectional view of a pixel circuit of a thin film transistor (TFT) array substrate included in an OLED display according to an exemplary embodiment. FIG. 2 is a top plan view of the TFT array substrate of FIG. 1 in which a buffer layer is formed. FIG. 3 is a perspective view of FIG. 2. FIG. 4 is a cross-sectional view of FIG. 3.

The TFT array substrate refers to a substrate including at least one TFT. In this specification, the TFT array substrate includes not only a case where a plurality of TFTs are regularly arranged, but also a case where a plurality of TFTs are irregularly arranged or a case where only one TFT is arranged.

Although application of the TFT array substrate to an OLED display is illustrated in exemplary embodiments, the described technology it not limited thereto. The TFT array substrate may be applied to various display devices such as liquid crystal display (LCD), electrophoretic display devices, and plasma display devices.

In order to clearly represent the features of the described technology, illustration of elements irrelevant to partial representation of a driving TFT T1, a storage capacitor Cst, and the like among elements such as some lines, some electrodes, and some semiconductor layers formed in a section taken along a cutting line is omitted in FIG. 1.

The TFT array substrate according to the present exemplary embodiment includes a substrate 110, a buffer layer 111 formed on the substrate 110, and a storage capacitor Cst formed in the buffer layer 111.

The buffer layer 111 may function as a barrier layer and/or a blocking layer that prevents diffusion of impurity ions, prevents infiltration of outside air or moisture, and planarizes a surface.

The buffer layer 111 may not be used in another exemplary embodiment, which will be described later in detail.

The storage capacitor Cst according to the present exemplary embodiment may be formed in a direction perpendicular to the substrate 110 as illustrated in FIG. 1. For example, a first electrode C1 and a second electrode C2 of the storage capacitor Cst may be formed in the buffer layer 111 in the direction perpendicular to the substrate 110 to be spaced apart from each other by a predetermined distance.

The first electrode C1 and the second electrode C2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

In a typical TFT array substrate, a storage capacitor is generally formed in a direction parallel to a substrate. That is, a lower electrode of the storage capacitor is formed on a buffer layer in parallel to the substrate, and an upper electrode thereof is formed on an insulating layer to be insulated from the lower electrode. In this case, a region for a TFT is reduced due to the formation of the storage capacitor. Also, in the case of a rear emission type display apparatus, there is a probability of light being blocked by the electrodes of a storage capacitor.

On the other hand, in the case of the TFT array substrate according to the present exemplary embodiment, the storage capacitor Cst is formed in the direction substantially perpendicular to the substrate 110 or the second electrode C2 surrounds the first electrode C1 such that they are formed on the same plane. Accordingly, even when the storage capacitor Cst is formed, the probability of reduction of a region for a TFT may be reduced.

Also, since the first electrode C1 and the second electrode C2 of the storage capacitor Cst is formed in the direction substantially perpendicular to the substrate 110, the probability of light being blocked by the electrodes may be reduced. That is, even in a rear emission type display device, the probability of light being blocked by the electrodes of the storage capacitor Cst may be reduced.

Thus, in the TFT array substrate according to the present exemplary embodiment, since the storage capacitor Cst is formed in the direction substantially perpendicular to the substrate 110, an aperture ratio thereof may be increased.

The first electrode C1 and the second electrode C2 may be formed to any depth d in the buffer layer 111.

The second electrode C2 of the storage capacitor Cst is insulated from the first electrode C1. For example, the second electrode C2 may be insulated from the first electrode C1 by being formed at a predetermined distance from the first electrode C1 in parallel to the first electrode C1.

That is, since the buffer layer 111 located between the first and second electrodes C1 and C2 insulates the first electrode C1 and the second electrode C2 from each other even when a separate insulating layer is not formed therebetween, the electrodes C1 and C2 may form the storage capacitor Cst.

A driving TFT T1 is formed on the buffer layer 111. The driving TFT T1 includes an active layer A1, a gate electrode G1, a source electrode S1, and a drain electrode D1. The source electrode S1 corresponds to a doped driving source region in the active layer A1, and the drain electrode D1 corresponds to a doped driving drain region in the active layer A1. In the active layer A1, a region between the driving source region and the driving drain region corresponds to a driving channel region.

The active layer A1 may include a channel region that is not doped with a dopant and is formed of polysilicon, and a source region and a drain region that are doped with a dopant and are formed on both sides of the channel region. Herein, the dopant depends on the type of the TFT, and may be an N-type dopant or a P-type dopant.

In some embodiments, as illustrated in FIG. 1, a gate insulating layer 120 is formed on the buffer layer 111 in which the storage capacitor Cst is formed and on which the active layer A1 is formed. The gate insulating layer 120 may include a single layer or multiple layers formed of an inorganic material such as silicon oxide or silicon nitride. The gate insulating layer 120 insulates the active layer A1 and the gate electrode G1 from each other.

A contact hole CNH may be formed in the gate insulating layer 120. The first electrode C1 and the drain electrode D1 of the driving TFT T1 may be connected through the contact hole CNH.

The gate electrode G1 of the driving TFT T1 may be formed on the gate insulating layer 120, and an interlayer insulating layer 130 may be formed on the gate electrode G1.

The gate electrode G1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

The interlayer insulating layer 130 may be formed on an entire surface of the substrate 110 to cover the gate electrode G1.

The interlayer insulating layer 130 may be formed of an inorganic material or an organic material. In some exemplary embodiments, the interlayer insulating layer 130 may be formed of an inorganic material. For example, the interlayer insulating layer 130 may be formed of metal oxide or metal nitride, and the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$). In some exemplary embodiments, the interlayer insulating layer 130 may be formed of a material having a dielectric constant of about 4 to about 7.

The interlayer insulating layer 130 may include a single layer or multiple layers formed of an inorganic material such as silicon oxide ($SiO_x$) and/or silicon nitride ($SiN_x$). In some exemplary embodiments, the interlayer insulating layer 130 may include a dual structure of $SiO_x/SiN_y$ or $SiN_x/SiO_y$.

Like in the gate insulating layer 120, a contact hole CNH may be formed in the interlayer insulating layer 130. The first electrode C1 and the drain electrode D1 of the driving TFT T1 may be connected through the contact hole CNH.

The TFT array substrate according to the present exemplary embodiment further includes a connector 140 on the interlayer insulating layer 130.

The connector 140 may connect the first electrode C1 and the drain electrode D1 of the driving TFT T1 through the contact hole CNH.

As illustrated in FIGS. 2 to 4, in the TFT array substrate according to the present exemplary embodiment, the storage capacitor Cst is formed on edges of the substrate 110. For example, the first electrode C1 is formed along and around four side edges of the substrate 110.

The second electrode C2 may be formed outside the first electrode C1 at a predetermined distance from the first electrode C1. Also, like the first electrode C1, the second electrode C2 may be formed along and around four side edges of the substrate 110.

A storage capacitor of a typical TFT array substrate is generally formed around a center portion of a substrate in parallel to the substrate. Accordingly, a region for a TFT is reduced, and the capacity of the storage capacitor is restricted.

On the other hand, since the storage capacitor Cst according to the present exemplary embodiment is formed in the direction substantially perpendicular to the substrate 110, space may be efficiently used and the capacity of the storage capacitor Cst may be increased without affecting the region for the TFT.

That is, since the storage capacitor Cst according to the present exemplary embodiment is formed in the direction perpendicular to the substrate 110, it may be formed on the edges of the substrate 110 as illustrated in FIGS. 2 to 4. Also, when the substrate 110 is formed to have a rectangular shape, the substrate 110 has four side edges and the storage capacitor Cst may be formed on each of four side edges of the substrate 110.

That is, the first electrode C1 and the second electrode C2 may be formed along and around four side edges of the substrate 110. Accordingly, since the storage capacitor Cst is formed on each of four side edges of the substrate 110, the capacity of the storage capacitor Cst formed by the first electrode C1 and the second electrode C2 may be increased.

The capacity of the storage capacitor Cst may be increased without affecting the region for the TFT. In addition, the aperture ratio may be increased as described above.

As illustrated in FIG. 4, the storage capacitor Cst may be formed on both ends of the substrate 110 from the viewpoint of a section of the TFT array substrate. This is because the storage capacitor Cst according to the present exemplary embodiment is formed along four side edges of the substrate 110.

As described above, since the storage capacitor Cst is formed connectively along four side edges of the substrate 110 and thus the storage capacitor Cst is formed on each of both ends of the substrate 110 from a sectional viewpoint, the capacity of the storage capacitor Cst of the TFT array substrate may be increased.

Figure 5:
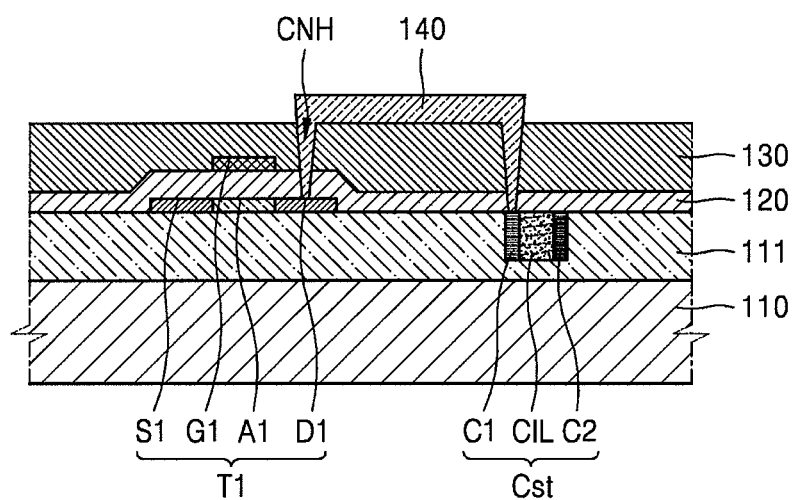
FIG. 5 is a cross-sectional view of a TFT array substrate according to another exemplary embodiment.

FIG. 5 is a cross-sectional view of a TFT array substrate according to another exemplary embodiment.

For convenience of description, redundant descriptions of the same elements of the present exemplary embodiment as those of the above exemplary embodiment will be omitted, and the following descriptions will focus on the elements of the present exemplary embodiment different from those of the above exemplary embodiment.

In the TFT array substrate according to the present exemplary embodiment, a storage insulating layer CIL is additionally formed between the first electrode C1 and the second electrode C2.

The buffer layer 111 may function as a storage insulating layer between the first electrode C1 and the second electrode C2 of the storage capacitor Cst that are formed at a predetermined distance from each other.

The storage insulating layer CIL may be additionally formed between the first electrode C1 and the second electrode C2 of the storage capacitor Cst according to the present exemplary embodiment. The storage insulating layer CIL may be formed of any material that may insulate the first electrode C1 and the second electrode C2 from each other.

Figure 6:
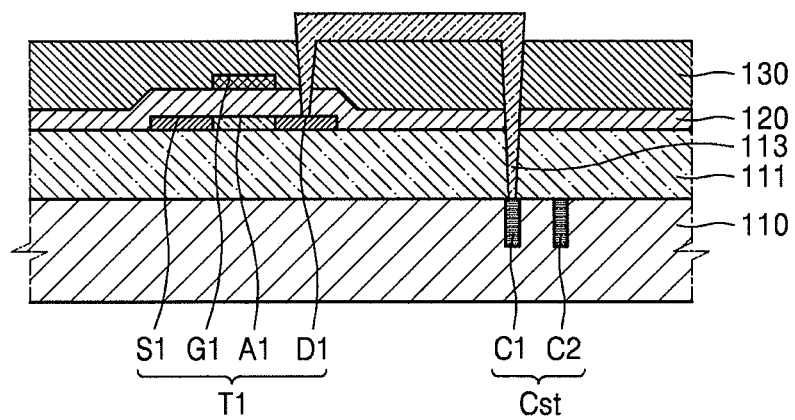
FIG. 6 is a cross-sectional view of a TFT array substrate according to another exemplary embodiment.

FIG. 6 is a cross-sectional view of a TFT array substrate according to another exemplary embodiment.

The TFT array substrate according to the present exemplary embodiment includes a substrate 110, a driving TFT T1 found on the substrate 110, and a storage capacitor Cst found in the substrate 110. Since the substrate 110 and the driving TFT T1 are the same as in the above exemplary embodiment, redundant descriptions thereof will be omitted for convenience of description.

The storage capacitor Cst may be formed in the substrate 110 in a direction substantially perpendicular to the substrate 110. That is, a first electrode C1 and a second electrode C2 may be formed by partially patterning the substrate 110 in the direction perpendicular to the substrate 110. The second electrode C2 may be formed at a predetermined distance from the first electrode C1 such that the second electrode C2 is insulated from the first electrode C1.

Since the substrate 110 insulates the first electrode C1 and the second electrode C2 from each other, a separate insulating layer is not required. Also, a storage insulating layer may be additionally formed between the first electrode C1 and the second electrode C2.

The storage capacitor Cst may be formed at edges of the substrate 110. That is, as in the above exemplary embodiment, the first electrode C1 and the second electrode C2 may be formed along and around four side edges of the substrate 110.

Accordingly, the capacity of the storage capacitor Cst may be increased, and the aperture may be improved.

Unlike the storage capacitor Cst of the above exemplary embodiment formed in the buffer layer 111, the storage capacitor Cst of the present exemplary embodiment is formed in the substrate 110.

Since the storage capacitor Cst of the present exemplary embodiment is the same as the storage capacitor Cst of the above exemplary embodiment except for this difference, redundant descriptions thereof will be omitted for convenience of description.

In the TFT array substrate, a buffer layer 111 may be formed on the substrate 110 having the storage capacitor Cst formed therein.

An electrode hole 113 may be formed in the buffer layer 111. The first electrode C1 and a drain electrode D1 of the driving TFT T1 may be connected through the electrode hole 113. Since the other features of the buffer layer 111 are the same as those of the above exemplary embodiment, redundant descriptions thereof will be omitted for convenience of description.

A gate insulating layer 120 and an interlayer insulating layer 130 may be formed on the buffer layer 111. Contact holes CNH may be formed in the gate insulating layer 120 and the interlayer insulating layer 130, and the first electrode C1 and the drain electrode D1 of the driving TFT T1 may be connected through the contact holes CNH. Since the other features of the gate insulating layer 120 and the interlayer insulating layer 130 are the same as those of the above exemplary embodiment, redundant descriptions thereof will be omitted for convenience of description.

Figure 7A:
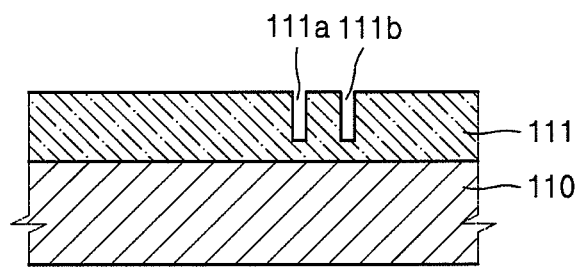
FIGS. 7A to 7C are sequential cross-sectional views illustrating a method of manufacturing a TFT array substrate illustrated in FIG. 3, according to an exemplary embodiment.
Figure 7B:
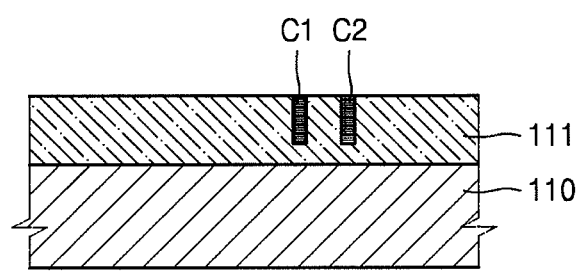
Figure 7C:
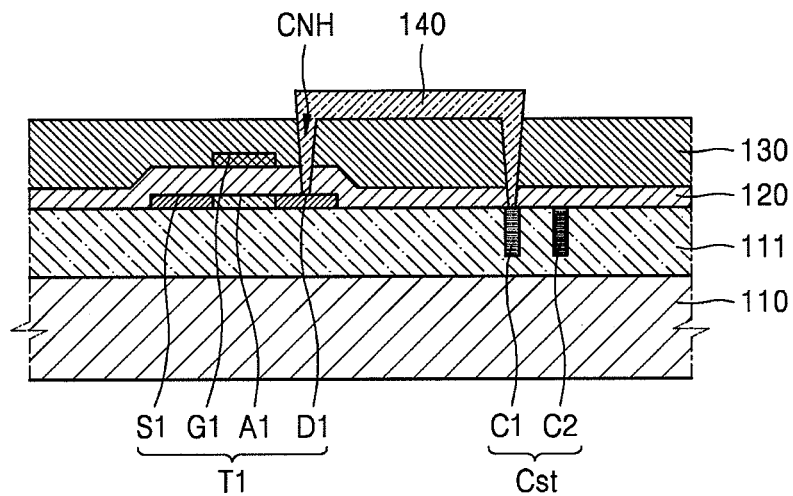

FIGS. 7A to 7C are sequential cross-sectional views illustrating a method of manufacturing a TFT array substrate illustrated in FIG. 3, according to an exemplary embodiment.

Referring to FIG. 7A, a buffer layer 111 may be formed on a substrate 110, and a first pattern 111a may be formed in the buffer layer 111 in a direction substantially perpendicular to the substrate 110. The first pattern 111a may be formed to a predetermined depth d in the buffer layer 111.

The first pattern 111a may be formed by mask-based patterning and etching processes. The etching process may be performed by wet etching, dry etching, or a combination thereof. Of course, a method of forming the first pattern 111a is not limited thereto.

Also, a second pattern 111b may be formed at a predetermined distance from the first pattern 111a in parallel to the first pattern 111a. The first pattern 111a and the second pattern 111b may be formed simultaneously or sequentially in any order.

The first pattern 111a and the second pattern 111b may be formed on edges of the substrate 110, and may be formed along and around four side edges of the substrate 110.

Referring to FIG. 7B, a first electrode C1 and a second electrode C2 may be deposited in the first pattern 111a and the second pattern 111b, respectively. The first electrode C1 and the second electrode C2 may be deposited simultaneously or sequentially in any order.

Referring to FIG. 7C, after the deposition of the first electrode C1 and the second electrode C2, an active layer A1 of a driving TFT may be formed on the buffer layer 111.

The active layer A1 may be formed of a semiconductor including amorphous silicon or crystalline silicon, and may be deposited by various deposition processes. In this case, the crystalline silicon may be formed by crystallizing the amorphous silicon. The amorphous silicon may be crystallized by various processes, such as rapid thermal annealing (RTA), solid phase crystallization (SPC), excimer laser annealing (ELA), metal induced crystallization (MIC), metal induced lateral crystallization (MILC), and sequential lateral solidification (SLS). The active layer A1 may be patterned by a photolithography process.

Also, a gate insulating layer 120 having a contact hole CNH formed therein may be formed on the active layer A1. The gate insulating layer 120 insulates the active layer A1 and a gate electrode G1 to be formed thereon. The gate insulating layer 120 is formed on an entire surface of the substrate 110 to cover the active layer A1.

The gate insulating layer 120 may be formed of an organic or inorganic insulator. In some exemplary embodiments, the gate insulating layer 120 may be formed of silicon nitride ($SiN_x$), silicon oxide ($SiO_2$), hafnium oxide, or aluminum oxide. For example, the gate insulating layer 120 may be formed by various deposition processes, such as sputtering, chemical vapor deposition (CVD), and plasma enhanced chemical vapor deposition (PECVD).

A gate electrode G1 insulated by the gate insulating layer 120 may be formed on the gate insulating layer 120. The gate electrode G1 may be formed to overlap with the active layer A1 at least partially.

The gate electrode G1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

Thereafter, using the gate electrode G1 as a mask, a dopant may be implanted into both ends of the active layer A1 to form a source electrode S1 and a drain electrode D1. When a trivalent dopant such as boron (B) is implanted in to a portion, the portion has p-type conductivity, and when a pentavalent dopant such as phosphorus (P), arsenic (As), or antimony (Sb) is implanted in to a portion, the portion has n-type conductivity.

Thereafter, an interlayer insulating layer 130 having a contact hole CNH formed therein may be formed to cover the gate electrode G1.

The interlayer insulating layer 130 may include a single layer of an organic material and an inorganic material or a stack structure thereof. In some exemplary embodiments, the interlayer insulating layer 130 may be formed of silicon nitride ($SiN_x$), silicon oxide ($SiO_2$), hafnium oxide, or aluminum oxide. In some exemplary embodiments, the interlayer insulating layer 130 may include a dual structure of $SiN_x/SiO_y$ or $SiO_x/SiN_y$. For example, the interlayer insulating layer 130 may be formed by various deposition processes, such as sputtering, chemical vapor deposition (CVD), and plasma enhanced chemical vapor deposition (PECVD).

Thereafter, a connector 140 may be formed on the interlayer insulating layer 130. The connector 140 may connect the first electrode C1 of the storage capacitor Cst and the drain electrode D1 of the driving TFT T1 through the contact hole CNH.

A method of manufacturing the TFT array substrate according to the exemplary embodiment illustrated in FIG. 6 is different from the above manufacturing method.

Referring to FIG. 6, a substrate 110 is first patterned, a second electrode C1 and a second electrode C2 are deposited in the patterns, and a buffer layer 111 is formed on the substrate 110.

A first pattern and a second pattern may be formed in the substrate 110 in a direction substantially perpendicular to the substrate 110, and may be formed by mask-based patterning and etching processes. The etching process may be performed by wet etching, dry etching, or a combination thereof. Of course, a method of forming the first pattern and the second pattern is not limited thereto.

Since the processes after the formation of the buffer layer 111 are the same as those of the above manufacturing method, redundant descriptions thereof will be omitted for convenience of description.

Figure 8:
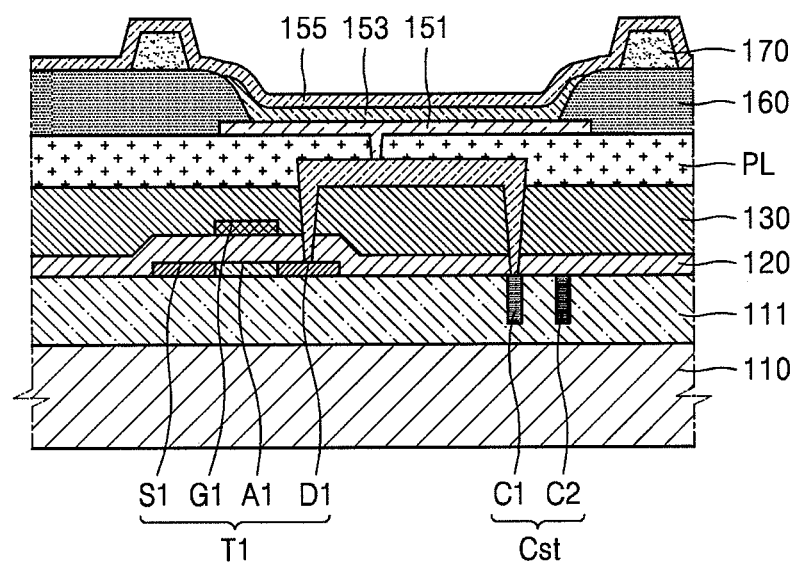
FIG. 8 is a schematic cross-sectional view of an organic light-emitting display apparatus according to an exemplary embodiment.

FIG. 8 is a schematic cross-sectional view of an OLED display according to an exemplary embodiment.

Referring to FIG. 8, the OLED display includes a TFT array substrate according to an exemplary embodiment. In FIG. 9, like reference numerals as in FIGS. 1 to 8 denote like elements. Thus, redundant descriptions thereof will be omitted herein for simplicity of description.

A planarization layer PL may be formed on an entire surface of a substrate 110 to cover a connector 140. A pixel electrode 151 may be formed on the planarization layer PL.

The planarization layer PL may be formed of an insulating material. For example, the planarization layer PL may be formed to have a single layer structure or a multilayer structure of an inorganic material, an organic material, or an organic/inorganic compound and may be formed by various deposition methods. In some exemplary embodiments, the planarization layer PL may be formed of at least one selected from polyacrylates resin, epoxy resin, phenolic resin, polyamides resin, polyimides rein, unsaturated polyesters resin, poly phenylenethers resin, poly phenylenesulfides resin, and benzocyclobutene (BCB).

In a display region of the OLED display, an OLED may be formed on the TFT array substrate. The OLED may include a pixel electrode 151, an intermediate layer 153 including an organic emission layer, and an opposite electrode 155. Also, the organic light-emitting display apparatus may further include a pixel definition layer 160 and a spacer 170.

The pixel electrode 151 and/or the opposite electrode 155 may be a transparent electrode or a reflective electrode. The transparent electrode may include indium tin oxide (ITO), indium zinc oxide (IZO), zinc oxide (ZnO), or indium oxide ($In_2O_3$), and the reflective electrode may include a reflective layer formed of Ag, Mg, Al, Pt, Pd, Au, Ni, Nd, Ir, Cr, or any combination thereof, or a transparent layer formed of ITO, IZO, ZnO, or $In_2O_3$. In some exemplary embodiments, the pixel electrode 151 or the opposite electrode 155 may have an ITO/Ag/ITO structure.

The pixel definition layer 160 may define a pixel region and a non-pixel region. The pixel definition layer 160 may include an opening that exposes the pixel electrode 151, and may be formed to cover an entire surface of the TFT array substrate.

The pixel electrode 151, the intermediate layer 153, and the opposite electrode 155 may constitute the organic light-emitting device OLED. Holes and electrons injected from the pixel electrode 151 and the opposite electrode 155 of the organic light-emitting device OLED may be combined in the organic emission layer of the intermediate layer 153 to generate light.

The intermediate layer 153 may include the organic emission layer. As another example, the intermediate layer 153 may include an organic emission layer and may further include at least one of a hole injection layer (HIL), a hole transport layer (HTL), an electron transport layer (ETL), and an electron injection layer (EIL). However, the present exemplary embodiment is not limited thereto, and the intermediate layer 153 may include an organic emission layer and may further include other various functional layers.

The opposite electrode 155 may be formed on the intermediate layer 153. The opposite electrode 155 may generate an electric field with the pixel electrode 151 to enable the intermediate layer 153 to emit light. The pixel electrode 151 may be patterned in each pixel, and the opposite electrode 155 may be formed to apply a common voltage to all pixels.

Although only one OLED is illustrated in the drawings, a display panel may include a plurality of OLEDs. A single pixel may be formed in each OLED, and a red color, a green color, a blue color, or a white color may be implemented at each pixel.

As described above, according to the one or more of the above exemplary embodiments, in the OLED display, since the first electrode C1 and the second electrode C2 of the storage capacitor Cst are formed around the edges of the substrate 110 in the direction substantially perpendicular to the substrate 110, the storage capacity of the storage capacitor Cst may be increased and the aperture ratio of the display apparatus may be improved.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope of the described technology as defined by the following claims.

What is claimed is:

1. A thin film transistor (TFT) array substrate comprising:
a buffer layer formed over a substrate;
a storage capacitor formed in the buffer layer and including a first electrode and a second electrode insulated from the first electrode, wherein the second electrode surrounds a perimeter of the first electrode; and
a driving TFT formed over the buffer layer.

2. The TFT array substrate of claim 1, further comprising a connector connecting the first electrode and a drain electrode of the driving TFT.

3. The TFT array substrate of claim 1, wherein the storage capacitor is formed on edges of the substrate.

4. The TFT array substrate of claim 3, wherein the first electrode is formed along four side edges of the substrate.

5. The TFT array substrate of claim 4, wherein the second electrode is formed at a predetermined distance from the first electrode and on a more outer side of the substrate than the first electrode, and wherein the second electrode is formed along four side edges of the substrate.

6. The TFT array substrate of claim 1, further comprising a storage insulating layer formed between and in substantially parallel to the first and second electrodes.

7. The TFT array substrate of claim 1, wherein the first and second electrodes are formed on the same plane.

8. The TFT array substrate of claim 1, wherein each of the first and second electrodes has a closed loop shape.

9. The TFT array substrate of claim 1, wherein the second electrode fully surrounds the first electrode on a plan view.

10. The TFT array substrate of claim 1, wherein each of the first and second electrodes is formed to have a closed loop on a plan view.

11. An organic light-emitting diode (OLED) display, comprising:
a display region including a plurality of pixels; and
a non-display region surrounding the display region, wherein each of the pixels comprises:
- a buffer layer formed over a substrate;
- a storage capacitor formed in the buffer layer and including a first electrode and a second electrode surrounding and insulated from the first electrode; and
- a driving TFT formed on the buffer layer.

12. The display of claim 11, wherein the first and second electrodes are formed on the same plane.

13. The display of claim 11, wherein each of the first and second electrodes has a closed loop shape.

* * * * *